United States Patent
Gallagher et al.

(10) Patent No.: US 7,955,778 B2
(45) Date of Patent: *Jun. 7, 2011

(54) COMPOSITIONS AND PROCESSES FOR PHOTOLITHOGRAPHY

(75) Inventors: Michael K. Gallagher, Hopkinton, MA (US); Deyan Wang, Hudson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/454,516

(22) Filed: May 19, 2009

(65) Prior Publication Data

US 2009/0233224 A1  Sep. 17, 2009

Related U.S. Application Data

(63) Continuation of application No. 11/716,910, filed on Mar. 12, 2007.

(60) Provisional application No. 60/781,455, filed on Mar. 10, 2006.

(51) Int. Cl.
G03C 1/492 (2006.01)
G03C 1/494 (2006.01)
G03C 1/76 (2006.01)
G03C 5/00 (2006.01)

(52) U.S. Cl. .................... 430/270.1; 430/273.1; 430/322

(58) Field of Classification Search ............... 430/270.1, 430/273.1, 322
See application file for complete search history.

(56) References Cited

U.S. PATENT DOCUMENTS

| 6,107,006 | A | 8/2000 | Chang |
| 7,473,512 | B2 | 1/2009 | Houlihan et al. |
| 7,585,612 | B2 * | 9/2009 | Thackeray et al. ........ 430/271.1 |
| 2005/0239296 | A1 | 10/2005 | Jung |
| 2007/0087286 | A1 | 4/2007 | Wang et al. |
| 2007/0160930 | A1 | 7/2007 | Wang et al. |
| 2007/0178406 | A1 | 8/2007 | Vohra et al. |
| 2007/0212646 | A1 * | 9/2007 | Gallagher et al. ......... 430/270.1 |
| 2008/0038661 | A1 | 2/2008 | Chiba et al. |
| 2008/0038676 | A1 | 2/2008 | Li et al. |
| 2010/0003615 | A1 | 1/2010 | Nakamura et al. |

FOREIGN PATENT DOCUMENTS

| EP | 1 517 179 | 3/2005 |
| EP | 1 612 604 | 1/2006 |
| WO | WO 03/102694 | 12/2003 |

OTHER PUBLICATIONS

European Search Report of corresponding European Application No. 07 25 0991.

* cited by examiner

*Primary Examiner* — Geraldina Visconti
(74) *Attorney, Agent, or Firm* — Jonathan D. Baskin

(57) ABSTRACT

Overcoating layer compositions are provided that are applied above a photoresist composition including for immersion lithography processing as well as non-immersion imaging.

18 Claims, No Drawings

COMPOSITIONS AND PROCESSES FOR PHOTOLITHOGRAPHY

This application is a continuation of application Ser. No. 11/716,910, filed Mar. 12, 2007, which claims the benefit of U.S. Provisional Application No. 60/781,455, filed Mar. 10, 2006, which applications are incorporated herein by reference in their entireties.

The present invention relates to overcoating layer compositions that are applied above a photoresist composition including for immersion lithography processing.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

The growth of the semiconductor industry is driven by Moore's law which states that the complexity of an IC device doubles on average every two years. This necessitates the need to lithographically transfer patterns and structures with ever decreasing feature size.

One approach to achieving smaller feature sizes is to use shorter wavelengths of light, however, the difficulty in finding materials that are transparent below 193 nm has led to the option of using immersion lithography to increase the numerical aperture of the lens by simply using a liquid to focus more light into the film. Immersion lithography employs a relatively high refractive index fluid between the last surface of an imaging device (e.g., KrF or ArF stepper) and the first surface on a wafer or other substrate.

Immersion microscopy has reported as a method for increasing the numerical aperture of a lens by using a liquid with an index of refraction greater than air. The improvement can be quantified and the minimum line width, W, is calculated as follows:

$$W = k_1 \lambda / NA \qquad \text{Eq. 1}$$

where $k_1$ is the resolution factor, $\lambda$ is the wavelength of light and NA is the numerical aperture.

For air which has an index of refraction of 1, the practical limit of the numerical aperture is 0.93. For materials with index greater than 1, NA greater than 1 are achievable based on the following formula:

$$NA = n \sin(\alpha) = d/(2f) \qquad \text{Eq. 2}$$

substituting for NA it is the equation can be simplified as shown below:

$$W = k_1 \lambda / n \sin(\alpha) \qquad \text{Eq. 3}$$

where n is the index of refraction of the immersion fluid and $\alpha$ is the acceptance angle of the lens. Thus for water which has an index of refraction of 1.47, a line width at 193 nm of 35 nm is possible.

Certain efforts have been made to develop materials for immersion lithography. See U.S. Patent Application Publication 2005/0239296. Extensive and proven immersion lithography systems however do not yet generally exist. Reliable and convenient photoresist and imaging processes for immersion lithography are clearly needed.

It would be desirable to new materials and processes for immersion photolithography In one aspect, we now provide new compositions ("overcoating compositions") and processes for immersion photolithography. We also provide new compositions that can be used an overcoat layer above a photoresist layer for use in non-immersion imaging processes.

In a preferred aspect, overcoating compositions of the invention comprise a copolymer (total of two distinct repeat units). The copolymer preferably comprise one or more hydrophilic groups such as hetero atom (N, O or S)-containing groups e.g. ester, ether, alcohol, carboxy or sulfoxy.

In another preferred aspect, overcoating compositions of the invention comprise at least two distinct resins. Preferably, one or both of the resins comprise one or more hydrophilic groups such as hetero atom (N, O or S)-containing groups e.g. ester, ether, alcohol, carboxy or sulfoxy.

In one embodiment, overcoating compositions are provided that do not contain a resin having fluorine substitution.

In another embodiment, overcoating compositions are provided that do contain a resin having fluorine substitution, such as a resin comprising fluorinated alcohol moieties, e.g. hexafluoropropyl alcohol ($(CF_3)_2CHOH$) groups.

In a further embodiment, overcoating compositions are provided that do not contain a resin having Si atoms.

In certain preferred aspects, one or more resins of the overcoating composition will have three distinct repeat units (terpolymers), four distinct repeat units (terpolymers), five distinct repeat units (pentapolymers), or even higher order polymers.

Preferred resin(s) of overcoating compositions of the invention may contain a variety of repeat units, including repeat units that comprise one or more hydrophilic groups as discussed. Particularly preferred resins contain polar groups such as ester, ether, carboxy, or sulfonyl groups.

In certain preferred aspects, one or more resins of the coating composition will comprise one or more groups that are reactive during lithographic processing, e.g. one or more photoacid-acid labile groups that can undergo cleavage reactions in the presence of acid and heat, e.g. acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound.

Preferred overcoating compositions of the invention may comprise a variety of materials and preferred overcoating composition components are higher molecular weight materials such as materials having a molecular weight in excess of about 500, 1000, 1500 or 2000 daltons.

Preferred overcoating compositions of the invention may comprise one or more optional components in addition to one or more resins, including one or more acid generator compounds, i.e. one or more thermal acid generator compounds and/or one or more photoacid generator compounds.

Preferred overcoating compositions of the invention also may optionally comprise one or more surfactant compounds.

It has been found that preferred overcoating compositions of the invention can exhibit favorable static and dynamic water contact angles as evaluated in an immersion lithography process. See Burnett et al., *J. Vac. Sci. Techn. B*, 23(6), pages 2721-2727 (November/December 2005) for a discussion of such water contact angles.

In certain aspects, for immersion lithography use, particularly preferred overcoating (top coat layer) compositions of the invention that are applied above a photoresist composition layer preferably can help at least inhibit migration of components of the photoresist layer into a immersion fluid (e.g.

water) employed in an immersion lithography process. As is understood, in an immersion lithography process, immersion fluid (e.g. water or some type of aqueous composition) is positioned between the exposure tool and the overcoating composition layer. The term "immersion fluid" as referred to herein means a fluid (e.g. water) interposed between an exposure tool and a photoresist coated substrate to conduct immersion lithography.

As referred to herein, an overcoating layer will be considered as inhibiting the migration of photoresist material into immersion fluid if a decreased amount of acid or organic material is detected in the immersion fluid upon use of the overcoating composition relative to the same photoresist system that is processed into the same manner, but in the absence of the overcoating composition layer. Detection of photoresist material in the immersion fluid can be conducted through mass spectroscopy analysis of the immersion fluid before exposure to the photoresist (with and without the overcoated overcoating composition layer) and then after lithographic processing of the photoresist layer with exposure through the immersion fluid. Preferably, the overcoating composition provides at least a 10 percent reduction in photoresist material (e.g., acid or organics as detected by mass spectroscopy) residing in the immersion fluid relative to the same photoresist that does not employ any overcoating layer (i.e. immersion fluid directly contacts the photoresist layer), more preferably the overcoating composition provides at least a 20, 50, or 100 percent reduction photoresist material (again, acid or organics) residing in to the immersion fluid relative to the same photoresist that does not employ any overcoating layer.

Preferred imaging wavelengths of lithographic systems of the invention include sub-300 nm wavelengths e.g. 248 nm, and sub-200 nm wavelengths e.g. 193 nm. Particularly preferred photoresists for use in systems of the invention may contain a photoactive component (e.g. one or more photoacid generator compounds) one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyl adamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norbornene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, compounds that comprise a hexafluoroalcohol moiety, and the like. Examples of such resins are disclosed e.g. in PCT/US99/21912.

The invention further provides methods for forming a photoresist relief image and producing an electronic device. The invention also provides novel articles of manufacture comprising substrates such as microelectronic (semiconductor) wafer substrates coated with a overcoating layer composition of the invention alone or in combination with a photoresist composition.

Other aspects of the invention are disclosed infra.

As discussed above, in a first aspect, methods for processing a photoresist composition, the methods comprising:

(a) applying on a substrate a photoresist composition;

(b) applying above the photoresist composition, an overcoating composition as disclosed herein. In preferred aspects, the overcoating composition may comprise one or more terpolymers or other higher resins;

(c) exposing the photoresist layer to radiation activating for the photoresist composition. In certain embodiments of the invention, the photoresist layer is exposed in an immersion lithography process, where immersion fluid contacts the overcoated composition layer.

In immersion lithography methods of the invention, a fluid having a refractive index of between about 1 and about 2 is suitably maintained between an exposure tool and the overcoating composition during the exposing. A variety of photoresists may be employed in these methods of the invention, e.g. chemically-amplified positive-acting photoresists and negative-acting photoresists.

In some aspects of these methods of the invention the photoresist composition will not be not thermally treated prior to applying the overcoated overcoating composition. Also, in some aspects of these methods of the invention, the substrate with the applied photoresist composition and overcoating composition is thermally treated prior to exposing to remove solvent from both the applied photoresist composition and the applied overcoating composition.

Methods and systems of the invention can be used with a variety of imaging wavelengths, e.g. radiation having a wavelength of less than 300 nm such as 248 nm or less than 200 such as 193 nm.

In another embodiment, lithography systems are provided such as a coated substrate system comprising: a substrate having thereon: 1) a coating layer of a photoresist composition; and 2) a coating layer of an overcoated composition above the photoresist composition layer, the overcoated composition comprising (i) one or more resins that comprise one or more hydrophilic groups. For immersion imaging, the lithography system may optionally further comprise an immersion photolithography exposure tool.

Overcoating Compositions

As discussed above, preferred overcoating compositions of the invention include those that comprise a copolymer (total of two distinct repeat units). The copolymer preferably comprises one or more hydrophilic groups such as hetero atom (N, O or S)-containing groups e.g. ester, ether, alcohol, carboxy or sulfoxy.

In another aspect, preferred overcoating compositions of the invention comprise at least two distinct resins. Preferably, one or both of the resins comprise one or more hydrophilic groups such as hetero atom (N, O or S)-containing groups e.g. ester, ether, alcohol, carboxy or sulfoxy.

A variety of resins may be employed in overcoating compositions of the invention, including resins that comprises polymerized acrylate groups, polyesters, and other repeat units and/or polymer backbone structures such as provided by e.g. poly(alkylene oxide), poly(meth)acrylic acid, poly(meth)acrylamides, polymerized aromatic (meth)acrylates, and polymerized vinyl aromatic monomers.

In one aspect of the invention, a polymer of an overcoating composition may comprise one or more repeat units that comprise one or more of the following moieties. In preferred systems, these moieties are present in a resin of a composition that comprises a resin blend (i.e. two or more distinct resins).

(i) Hetero-substituted carbocyclic aryl groups such as hydroxynaphthyl groups as such groups are disclosed in U.S. Published Patent Application 2004/0038150. A hetero-substituted carbocyclic aryl group means that the carbocyclic group has one or more, typically one, two or three, ring substituents that contain one or more hetero atoms, particularly oxygen (e.g. hydroxyl or ether) or sulfur. That is, such references to "hetero-substituted" designate moieties that contain one or more hetero atoms, particularly one or two oxygen and/or sulfur atoms, that are ring substituents of the carbocyclic aryl group. A hydroxy naphthyl group or other similar term means a naphthyl group that has at least one hydroxy ring substituents. The naphthyl group may suitably have more than one hydroxy group, such as two or three hydroxy ring substituents, although it is generally preferred that the naphthyl group contain a single hydroxy substituent. Such resin groups may be provided by polymerization of a vinyl hydroxynaphthyl monomer as disclosed in U.S. Published Patent Application 2004/003815.

(ii) acid esters such as succinate groups, e.g. as may be provided by polymerization a vinyl or acrylate monomer such as mono-2-(methacryloyl-oxy)ethyl succinate of the following structure:

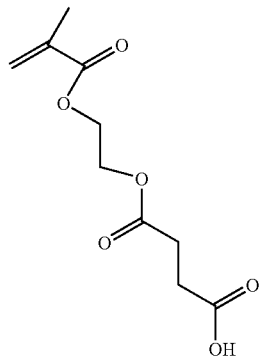

(iii) fluorinated groups included fluorinated alcohols e.g. hexafluoroproyl alcohol e.g. as may be provided by polymerization a vinyl or acrylate monomer such as 4,4,4-trifluoro-3-hydroxy-1-methyl-3-trifluoromethyl-butyl methacrylate and 1-cyclohexyl-3-hydroxy-4,4,4-trifluoro-3-(trifluoromethyl)butyl methacrylate of the following structures:

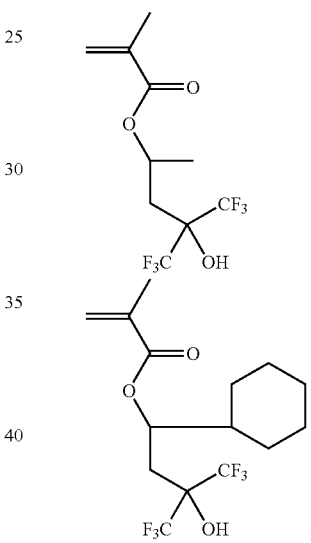

(iv) relatively hydrophobic groups such as groups having 4, 5, 6, 7, 8 or more carbon atoms (generally not necessary to employ a group having in excess of 35 or 30 carbons) e.g. as may be provided by polymerization a vinyl or acrylate monomer such as octyl merthacrylate, octyl methacrylate, decyl methacrylate, dodecylmethacrylate.

In certain preferred systems, the coating composition may comprise at least two distinct resins, wherein the first resin will comprise at least two differing repeat units and the second resin comprises no more than two differing repeat units and suitably may be a homopolymer (only contains one type of repeat unit). In such systems, each of the first and second resins may suitably comprise hydrophilic groups such as ester, carboxy, ether and/or acetal groups. In preferred aspects, each of the first and second resins may suitably comprise photoacid-labile groups such as photoacid-labile ester, and/or acetal groups.

In coating compositions of the invention, it also may be preferred to include yet additional distinct, e.g. where the composition comprises one or more additional distinct resins that are distinct from the first and second resins as described herein.

Resins of preferred overcoating compositions of the invention will have a weight average molecular weight in excess of about 400, 500, 1000, 1500 or 2000 daltons.

In certain preferred aspects, one or more resins of the coating composition will comprise one or more groups that are reactive during lithographic processing, e.g. one or more photoacid-labile groups that can undergo cleavage reactions in the presence of acid and heat, e.g. acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound.

In certain preferred systems, an overcoating composition of the invention comprises at least two distinct resins wherein a first resin comprises one or more photoacid-labile groups and a second resin distinct from the first resin comprises one or more groups (i) through (iv) as discussed above (i.e. hetero-substituted carbocyclic aryl groups such as hydroxynaphthyl groups; acid esters such as succinate groups; fluorinated groups included fluorinated alcohols; relatively hydrophobic groups such as groups having 4, 5, 6, 7, 8 or more carbon atoms).

As discussed above, in a preferred aspect, an overcoating composition may contain one or more acid generator compounds, e.g. one or more thermal acid generator compounds and/or one or more photoacid generator compounds. Suitable photoacid generator compounds for use in an overcoating composition are discussed below with respect to photoresist compositions and particularly include non-ionic compounds such as imidosulfonates, e.g. compounds of the following formula:

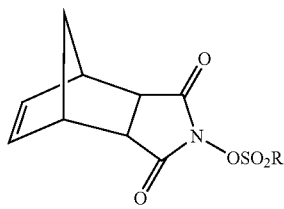

wherein R is camphor, adamantane, alkyl (e.g. $C_{1-12}$ alkyl) and perfluoroalkyl such as perfluoro($C_{1-12}$alkyl), particularly perfluorooctanesulfonate and perfluorononanesulfonate. A specifically preferred photoacid generator compound for use in an overcoating composition is N-[(perfluorooctanesulfonyl)oxy]-5-norbornene-2,3-dicarboximide.

Thermal acid generator compounds also may be employed in overcoating compositions of the invention including ionic or substantially neutral thermal acid generators, e.g. an ammonium arenesulfonate salt.

If employed, one or more acid generators may be utilized in relatively small amounts in an overcoating composition, e.g. 0.1 to 10 percent by weight of the total of the dry components of the composition (all components except solvent carrier), such as about 2 percent by weight of the total dry components.

Such use of one or more acid generator compounds can favorably impact lithographic performance, particularly resolution, of the developed image patterned in an underlying resist layer.

A further preferred optional additive of overcoating compositions of the invention is one or more surfactants, which can promote formation of a substantially uniform coating layer of the overcoated composition. A variety of surfactants may be employed. Typical surfactants exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-102, X-45, X-15 and alcohol ethoxylates such as BRIJ® 56 ($C_{1-6}H_{33}$ $(OCH_2CH_2)_{10}OH)(ICl)$, BRIJ® 58 ($C_{16}H_{33}(OCH_2CH_2)$ 20 OH)(ICl). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

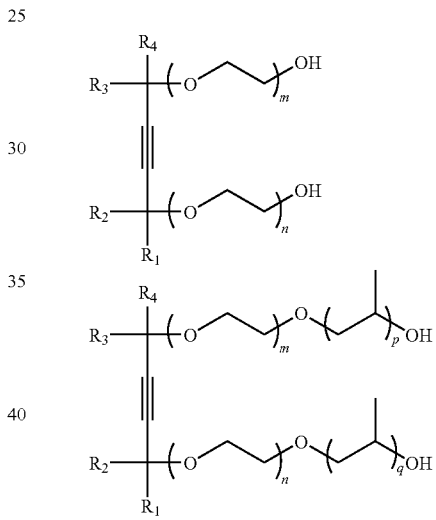

wherein in those formulae R1 and R4 are a straight or a branched alkyl chain suitably having from 3 to 10 carbon atoms; R2 and R3 are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

One or more surfactants may be suitably present in relatively small amounts e.g. less than 5, 4, 3, 2, 1 or 0.5 weight percent relative to weight of total solids (total solids being all compositions components except solvent carrier).

Preferred overcoating composition layers will have an index of refraction of about 1.4 or greater at 193 nm including about 1.47 or greater at 193 nm. Additionally, for any particular system, the index of refraction can be tuned by changing the composition of the resin(s) of the overcoating composition, including by altering the ratio of components of a resin blend, or composition of any of the resin(s) of an overcoating composition. For instance, increasing the amount of organic content in an overcoating layer composition can provided increased refractive index of the layer.

Preferred overcoating layer compositions will have a refractive index between of the immersion fluid and the refractive index of the photoresist at the target exposure wavelength (e.g. 193 nm or 248 nm).

Preferred solvent materials to formulate and cast an overcoating composition are any which dissolve or disperse the component(s) of the overcoating layer composition (e.g., one or more resins) but do not appreciably dissolve an underlying photoresist layer. More particularly, suitable solvents to formulate an overcoating composition include one or more of, but are not limited to, alcohols such as isopropanol, n-butanol, alkylene glycols, such as propylene glycol. Alternatively nonpolar solvents such as aliphatic and aromatic hydrocarbons such as dodecane, isooctane, mesitylene and xylenes may be used.

Particularly preferred solvents to formulat and cast an overcoating composition include 1) di(propylene glycol) mono methyl ether (DPGME) and 2) alkanes or cycloalkanes including cyclohexane, octane, decane, dodecane and their isomers. Especially preferred is used of a solvent composition that comprises a mixture of both 1) di(propylene glycol) mono methyl ether (DPGME) and 2) alkanes and/or cycloalkanes including cyclohexane, octane, decane, dodecane and their isomers.

An overcoating or composition may be suitably preferred by admixture of one or more solid components (e.g. one or more resins) into one or more polar solvents such as those identified above or alternatively one or more non-polar solvents such as the aliphatic and aromatic hydrocarbons identified above. See Example 1 which follows for exemplary for preparation of overcoating compositions of the invention.

In overcoating compositions comprising multiple resins, the distinct resins suitably may be present in varying relative amounts.

For instance, a second distinct resin suitably may be present in about equal weight amounts as a first distinct resin, or may be present in lesser amount, e.g. about 40, 30, 20, 15, 10 or 5 weight percent of less relative to the first resin. The second resin also may be in greater weight amounts than the first resin.

Photoresists

A wide variety of photoresist compositions may be used in combination with overcoating layer compositions and processes of the invention.

As discussed above, preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of lithography systems of the invention. Acetal photoacid-labile groups also will be preferred.

The photoresists used in accordance with the invention typically comprise a resin component and a photoactive component. Preferably the resin has functional groups that impart alkaline aqueous developability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly(vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

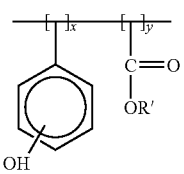

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(═O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

For imaging at sub-200 nm wavelengths such as 193 nm, preferably a photoresist is employed that contains one or more polymers that are substantially, essentially or completely free of phenyl or other aromatic groups. For example, for sub-200 mm imaging, preferred photoresist polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions of the invention comprise a mixture of materials that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

The resin component of resists useful in accordance with the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

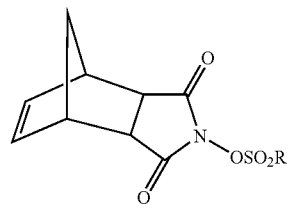

wherein R is camphor, adamantane, alkyl (e.g. $C_{1-12}$ alkyl) and perfluoroalkyl such as perfluoro($C_{1-12}$alkyl), particularly perfluorooctanesulfonate and perfluorononanesulfonate. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

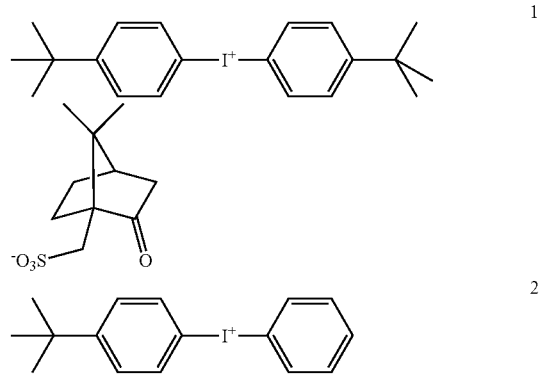

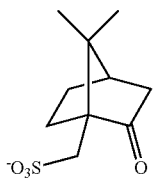

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$ alkyl), particularly perfluorooctanesulfonate, perfluorobutanesulfonate and the like.

Other known PAGS also may be employed in photoresists used in accordance with the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Lithographic Processing

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

An overcoating composition of the invention can be applied over the photoresist composition by any suitable methods, with spin coating being preferred.

Following coating of the photoresist onto a surface, it may be dried by heating to remove the solvent until preferably the photoresist coating is tack free, or as discussed above, the photoresist layer may be dried after the overcoating layer composition has been applied and the solvent from both the photoresist composition and overcoating composition layers substantially removed in a single thermal treatment step.

The photoresist layer with overcoating composition layer is then exposed to patterned radiation activating for the photoactive component of the photoresist.

In an immersion lithography system, the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

During the exposure step (whether immersion where fluid is interposed, or non-immersion where such fluid is not interposed), the photoresist composition layer is exposed to patterned activating radiation with the exposure energy typically ranging from about 1 to 100 $mJ/cm^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-300 and sub-200 nm exposure wavelength, with 248 nm and 193 nm being particularly preferred exposure wavelengths as well as EUV and 157 nm.

Following exposure, the film layer of the composition is preferably baked at temperatures ranging from about 70° C. to about 160° C. Thereafter, the film is developed, preferably by treatment with an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

The following non-limiting examples are illustrative of the invention.

EXAMPLE 1

Overcoating Composition Preparation and Coating

A coating composition of the invention was prepared by admixing the following components in the following amounts based on total composition weight:
1. 3.0 weight % of poly t-butylmethacrylate-co-methacrylic acid (80/20)
2. 10.0 weight % depropyleneglycol monomethylether
3. 87.0 weight % 2 methyl-1-butanol This composition was spin-coated onto a dried photoresist layer that had been applied to a silicon wafer substrate. No film thickness loss was observed for the resist. The coating quality was good with less than one percent coating layer thickness variation across the applied coating layer.

EXAMPLE 2

Overcoating Composition Preparation and Coating

A further coating composition of the invention was prepared by admixing the following components in the following amounts based on total composition weight:
1. 3.0 weight % of poly t-butylmethacrylate-co-methacrylic acid
2. 0.015 weight % PF-656 fluorinated surfactant
3. 10.0 weight % depropyleneglycol monomethylether
4. 86.085 weight % 2 methyl-1-butanol This composition was spin-coated onto a dried photoresist layer that had been applied to a silicon wafer substrate. The coating quality was good with less than one percent coating layer thickness variation across the applied coating layer.

EXAMPLE 3

Composition Preparation and Lithographic Processing

A further overcoating composition of the invention was prepared by admixing the following components in the following amounts based on total composition weight:
1. 3.0 weight % of poly t-butylmethacrylate-co-methacrylic acid
2. 0.009 weight % of poly t-butylmethacrylate
4. 0.015 weight % PF-656 fluorinated surfactant
5. 10.0 weight % depropyleneglycol monomethylether
6. 86.076 weight % 2 methyl-1-butanol This composition was spin-coated onto a dried photoresist layer that had been applied to a silicon wafer substrate. The coating quality was good with less than one percent coating layer thickness variation across the applied coating layer. The refractive index of the film was 1.63 at 193 nm wavelength.

EXAMPLE 4

Overcoating Composition Preparation and Lithographic Processing

A further coating composition of the invention was prepared by admixing the following components in the following amounts based on total composition weight:
1. 3.0 weight % of poly t-butylmethacrylate-co-methacrylic acid
2. 0.009 weight % of poly t-butylmethacrylate
4. 0.015 weight % PF-656 fluorinated surfactant
5. 0.03 weight % triphenylsulfonium perfluorobutanesulfonate
6. 10.0 weight % depropyleneglycol monomethylether
7. 86.061 weight % 2 methyl-1-butanol This composition was spin-coated onto a dried photoresist layer that had been applied to a silicon wafer substrate. The coating quality was good with less than one percent coating layer thickness variation across the applied coating layer. The refractive index of the film was 1.63 at 193 nm wavelength.

EXAMPLE 5

Overcoating Composition Preparation and Lithographic Processing

A further coating composition of the invention was prepared by admixing the following components in the following amounts based on total composition weight:
1. 3.0 weight % of poly t-butylmethacrylate-co-methacrylic acid
2. 0.009 weight % of 94/6 poly(t-butyl methacrylate-co-methacrylic acid)
4. 0.015 weight % PF-656 fluorinated surfactant
5. 0.03 weight % triphenylsulfonium perfluorobutanesulfonate
6. 10.0 weight % depropyleneglycol monomethylether
7. 86.061 weight % 2 methyl-1-butanol This composition was spin-coated onto a dried photoresist layer that had been applied to a silicon wafer substrate. The coating quality was good with less than one percent coating layer thickness variation across the applied coating layer. The refractive index of the film was 1.63 at 193 nm wavelength.

EXAMPLE 6

Overcoating Composition Preparation and Lithographic Processing

A further coating composition of the invention was prepared by admixing the following components in the following amounts based on total composition weight:
1. 3.0 weight % of poly t-butylmethacrylate-co-methacrylic acid
2. 0.009 weight % of 94/6 poly(t-butyl methacrylate-co-carboxyethyl acrylate)
4. 0.015 weight % PF-656 fluorinated surfactant 5. 0.03 weight % triphenylsulfonium perfluorobutane-sulfonate
6. 10.0 weight % depropyleneglycol monomethylether
7. 86.061 weight % 2 methyl-1-butanol This composition was spin-coated onto a dried photoresist layer that had been applied to a silicon wafer substrate. The coating quality was good with less than one percent coating layer thickness variation across the applied coating layer.
The refractive index of the film was 1.63 at 193 nm wavelength.

EXAMPLE 7

Overcoating Composition Preparation and Lithographic Processing

A further coating composition of the invention was prepared by admixing the following components in the following amounts based on total composition weight:
1. 3.0 weight % of poly t-butylmethacrylate-comethacrylic acid
2. 0.009 weight % of poly t-butylmethacrylate 4. 0.015 weight % PF-656 fluorinated surfactant
5. 0.03 weight % triphenylsulfonium perfluorobutane-sulfonate
6. 0.00015 weight % NACL
7. 10.0 weight % depropyleneglycol monomethylether
8. 86.061 weight % 2 methyl-1-butanol This composition was spin-coated onto a dried photoresist layer that had been applied to a silicon wafer substrate. The coating quality was good with less than one percent coating layer thickness variation across the applied coating layer.
The refractive index of the film was 1.64 at 193 nm wavelength. Add defect

EXAMPLES 8-44

Additional Resin Systems

Additional resin systems were prepared and evaluated. Specifically, alternate copolymers were evaluated by substitution for copolymer 1 in Examples 1-5 above. The additional copolymers, solution stability and coating quality are summarized below in Table 1:

TABLE 1

| Example | Monomer 1 | Monomer 2 | Monomer 3 | Ratio |
|---|---|---|---|---|
| 8 | t-butyl methacrylate | methacrylic acid | — | 98/2 |
| 9 | t-butyl methacrylate | methacrylic acid | — | 96/4 |
| 10 | t-butyl methacrylate | methacrylic acid | — | 94/6 |
| 11 | t-butyl methacrylate | methacrylic acid | — | 90/10 |
| 12 | t-butyl methacrylate | methacrylic acid | — | 85/15 |
| 13 | t-butyl methacrylate | methacrylic acid | — | 70/30 |
| 14 | t-butyl methacrylate | methacrylic acid | — | 60/40 |
| 15 | t-butyl acrylate | acrylic acid | — | 90/10 |
| 16 | t-butyl acrylate | acrylic acid | — | 60/40 |
| 17 | t-butyl acrylate | methacrylic acid | — | 90/10 |
| 18 | t-butyl acrylate | methacrylic acid | — | 60/40 |
| 19 | t-butyl methacrylate | acrylic acid | — | 90/10 |
| 20 | t-butyl methacrylate | acrylic acid | — | 60/40 |
| 21 | ethylcyclopentyl methacrylate | acrylic acid | — | 90/10 |
| 22 | ethylcyclopentyl methacrylate | acrylic acid | — | 60/40 |
| 23 | ethylcyclopentyl acrylate | acrylic acid | — | 90/10 |
| 24 | ethylcyclopentyl acrylate | acrylic acid | — | 60/40 |
| 25 | ethylcyclopentyl methacrylate | methacrylic acid | — | 90/10 |
| 26 | ethylcyclopentyl methacrylate | methacrylic acid | — | 60/40 |
| 27 | ethylcyclopentyl methacrylate | methacrylic acid | — | 90/10 |
| 28 | ethylcyclopentyl methacrylate | methacrylic acid | — | 60/40 |
| 29 | ethylhexyl acrylate | methacrylic acid | — | 70/30 |
| 30 | ethylhexyl acrylate | acrylic acid | — | 80/20 |
| 31 | ethylhexyl methacrylate | methacrylic acid | — | 60/40 |
| 32 | ethylhexyl methacrylate | acrylic acid | — | 80/20 |
| 33 | methyladamantyl methacrylate | methacrylic acid | — | 70/30 |
| 34 | methyladamantyl methacrylate | acrylic acid | — | 75/25 |
| 35 | methyladamantyl acrylate | methacrylic acid | — | 65/35 |
| 36 | methyladamantyl acrylate | acrylic acid | — | 60/40 |
| 37 | ethylhexyl acrylate | methacrylic acid | trimethylopropane tracrylate | 70/25/5 |
| 38 | ethylhexyl acrylate | acrylic acid | allylmethacrylate | 70/20/10 |
| 39 | methyladamantyl methacrylate | methacrylic acid | trimethylpropanetrimethacrylate | 70/20/10 |

TABLE 1-continued

| Example | Monomer 1 | Monomer 2 | Monomer 3 | Ratio |
|---|---|---|---|---|
| 40 | methyladamantyl methacrylate | acrylic acid | trimethylopropane tracrylate | 65/25/10 |
| 41 | t-butyl acrylate | methacrylic acid | allylmethacrylate | 70/20/10 |
| 42 | t-butyl methacrylate | acrylic acid | trimethylpropanetrimethacrylate | 65/25/10 |
| 43 | ethylcyclopentyl acrylate | acrylic acid | allylmethacrylate | 70/20/10 |
| 44 | ethylcyclopentyl methacrylate | methacrylic acid | trimethylpropanetrimethacrylate | 65/25/10 |

EXAMPLES 45-89

Additional Multiple Resin Systems

Alternate copolymers were evaluated by substitution for the second polymer (smaller weight amount component) in Examples 3-5 above. The new additional tested polymers, solution stability and coating quality are summarized below in Table 2.

TABLE 2

| Example | Monomer 1 | Monomer 2 | Ratio |
|---|---|---|---|
| 45 | t-butyl methacrylate | methacrylic acid | 98/2 |
| 46 | t-butyl methacrylate | methacrylic acid | 96/4 |
| 47 | t-butyl methacrylate | methacrylic acid | 94/6 |
| 48 | t-butyl methacrylate | acrylic acid | 98/2 |
| 49 | t-butyl methacrylate | acrylic acid | 96/4 |
| 50 | t-butyl methacrylate | acrylic acid | 94/6 |
| 51 | t-butyl acrylate | acrylic acid | 98/2 |
| 52 | t-butyl acrylate | acrylic acid | 96/4 |
| 53 | t-butyl acrylate | acrylic acid | 94/6 |
| 54 | t-butyl acrylate | methacrylic acid | 98/2 |
| 55 | t-butyl acrylate | methacrylic acid | 96/4 |
| 56 | t-butyl acrylate | methacrylic acid | 94/6 |
| 57 | ethylcyclopentyl methacrylate | methacrylic acid | 98/2 |
| 58 | ethylcyclopentyl methacrylate | methacrylic acid | 96/4 |
| 59 | ethylcyclopentyl methacrylate | methacrylic acid | 94/6 |
| 60 | ethylcyclopentyl acrylate | acrylic acid | 98/2 |
| 61 | ethylcyclopentyl acrylate | acrylic acid | 96/4 |
| 62 | ethylcyclopentyl acrylate | acrylic acid | 94/6 |
| 63 | ethylcyclopentyl acrylate | methacrylic acid | 98/2 |
| 64 | ethylcyclopentyl acrylate | methacrylic acid | 96/4 |
| 65 | ethylcyclopentyl acrylate | methacrylic acid | 94/6 |
| 66 | t-butyl methacrylate | — | 100 |
| 67 | t-butyl acrylate | — | 100 |
| 68 | ethylcyclopentyl acrylate | — | 100 |
| 69 | ethylcyclopentyl methacrylate | — | 100 |
| 70 | ethylhexyl methacrylate | — | 100 |
| 71 | ethylhexyl acrylate | — | 100 |
| 72 | methyladamantyl methacrylate | — | 100 |
| 73 | methyladamantyl acrylate | — | 100 |
| 74 | ethylhexyl methacrylate | | 95/5 |
| 75 | ethylhexyl acrylate | methacrylic acid | 95/5 |
| 76 | ethylhexyl acrylate | acrylic acid | 95/5 |
| 77 | ethylhexyl methacrylate | methacrylic acid | 95/5 |
| 78 | ethylhexyl methacrylate | acrylic acid | 95/5 |
| 79 | methyladamantyl methacrylate | methacrylic acid | 95/5 |
| 80 | methyladamantyl methacrylate | acrylic acid | 95/5 |
| 81 | methyladamantyl acrylate | methacrylic acid | 95/5 |
| 82 | methyladamantyl acrylate | acrylic acid | 95/5 |
| 83 | methyladamantyl acrylate | carboxymethyl acrylate | 95/3 |
| 84 | methyladamantyl acrylate | carboxyethyl acrylate | 95/6 |
| 85 | t-butyl acrylate | carboxyethyl acrylate | 96/4 |
| 86 | t-butyl methacrylate | carboxyethyl acrylate | 95/6 |
| 87 | t-butyl methacrylate | carboxymethyl acrylate | 95/6 |
| 88 | t-butyl acrylate | carboxymethyl acrylate | 96/4 |
| 89 | t-butyl methacrylate | carboxyethyl acrylate | 95/6 |

EXAMPLES 90

Surfactant Evaluations

Alternate surfactants and surface modification agents were evaluated by substitution for Surfynol 440 in the coating composition of Example 5 above. The solution stability and coating quality were summarized below in Table 3.

TABLE 3

| Tradename | Class | Amount weight % | Solution Stability | Coating Quality |
|---|---|---|---|---|
| Dynol 604 | Ethyloxylate acetylenic diol (nonionic type) | 0.001 | Unstable | Poor |
| Pluronic 25R2 | Polypropylene/ ethyleneoxide polymer (nonionic type) | 0.001 | Stable | Good |
| Polyfox151N | Fluorinated oligomer (nonionic type) | 0.002 | Unstable | Poor |
| Polyfox156A | Fluorinated oligomer (anionic type) | 0.100 | Stable | Good |
| Silwet 7604 | Siloxane-PEO (nonionic type) | 0.001 | Unstable | Poor |
| | Ethoxylated phenol (nonionic type) | 0.001 | Stable | Good |

TABLE 3-continued

| Tradename | Class | Amount weight % | Solution Stability | Coating Quality |
|---|---|---|---|---|
| | Polyethyleneglycol-propyltriethoxysilane (nonionic type) | 0.001 | Stable | Good |
| Surfynol 465 | Ethyloxylate acetylenic diol (nonionic type) | 0.001 | Stable | Good |
| Surfynol 485 | Ethyloxylate acetylenic diol (nonionic type) | 0.001 | Stable | Good |

EXAMPLE 91

Water Contact Angle Evaluations

Water contact angles were evaluated for the coating compositions having the composition of the example specified in Table 4 below with the particular resin employed in the composition. Several water contact angles were evaluated: static, receding, advancing and sliding in general accordance with the procedures disclosed in Burnett et al., *J. Vac. Sci. Techn. B*, 23(6), pages 2721-2727 (November/December 2005). Results are set forth in Table 4 below.

TABLE 4

| Example | Matrix Polymer | θ static | θ recerding | θ advancing | θ sliding |
|---|---|---|---|---|---|
| 1 | 80/20 t-butylmethacrylate/methacrylic acid | 80 | 63 | 86 | 27 |
| 1 | 70/30 t-butylmethacrylate/methacrylic acid | 80 | 52 | 84 | 33 |
| 1 | 60/40 t-butylmethacrylate/methacrylic acid | 77 | 41 | 80 | 42 |
| 2 | 80/20 t-butylmethacrylate/methacrylic acid | 89 | 63 | 89 | 27 |
| 2 | 70/30 t-butylmethacrylate/methacrylic acid | 84 | 52 | 86 | 36 |
| 2 | 60/40 t-butylmethacrylate/methacrylic acid | 84 | 43 | 83 | 46 |
| 4 | 60/40 t-butylmethacrylate/methacrylic acid | 89 | 77 | 91 | 17 |
| 5 | 60/40 t-butylmethacrylate/methacrylic acid | 88 | 74 | 91 | 17 |
| 6 | 60/40 t-butylmethacrylate/methacrylic acid | 87 | 71 | 90 | 20 |
| 7 | 60/40 t-butylmethacrylate/methacrylic acid | 87 | 79 | 91 | 12 |

EXAMPLE 92

Immersion Lithography

A coating composition of Example 1 is spin coated on to silicon wafers having a coating layer of a deblocking-methacrylate based 193 nm positive photoresist had already been deposited. The photoresist is then imaged in an immersion lithography system with patterned radiation having a wavelength of 193 nm.

EXAMPLE 93

Defect Reduction

A 193 nm chemically-amplified positive photoresist was spin coated onto silicon wafers substrate and those coated wafers were soft-baked on a vacuum hotplate to remove solvent.

For one resist-coated wafer, a coating composition of type disclosed in Example 1 was spin coated. For another resist-coated wafer, an overcoating coating composition was not applied.

Both wafers were exposed to patterned 193 nm radiation, post-exposure baked and then developed with an aqueous alkaline developer solution. The wafer that had been coated with the composition of the type disclosed in Example 5 showed fewer post-development defects (discernable residues) than the wafer that had not been coated.

What is claimed is:

1. An overcoating composition for use with an underlying photoresist in an immersion lithography process, comprising: a first resin, a second resin that is distinct from the first resin and a solvent comprising di(propylene glycol) mono methyl ether.

2. The overcoating composition of claim 1, wherein the solvent further comprises an alkane and/or a cycloalkane.

3. The overcoating composition of claim 2, wherein alkane and/or cycloalkane are chosen from cyclohexane, octane, decane, dodecane and their isomers.

4. The overcoating composition of claim 1, further comprising an acid generator compound.

5. The overcoating composition of claim 1, wherein the acid generator compound is a photoacid generator compound.

6. The overcoating composition of claim 1, wherein the first or second resin comprise a photoacid-labile group.

7. The overcoating composition of claim 1, wherein the first or second resin comprises an ester, acetal, ether, hydroxyl or carboxy group.

8. A coated substrate, comprising: a photoresist composition layer on a substrate; above the photoresist layer, an overcoating composition comprising a first resin, a second resin that is distinct from the first resin and a solvent comprising di(propylene glycol) mono methyl ether.

9. The coated substrate of claim 8, wherein the solvent further comprises an alkane and/or a cycloalkane.

10. The coated substrate of claim 9, wherein alkane and/or cycloalkane are chosen from cyclohexane, octane, decane, dodecane and their isomers.

11. The coated substrate of claim 8, wherein the overcoating composition further comprises an acid generator compound.

12. The coated substrate of claim 11, wherein the acid generator compound is a photoacid generator compound.

13. The coated substrate of claim 8, wherein the first or second resin comprise a photoacid-labile group.

14. The coated substrate of claim 8, wherein the first or second resin comprises an ester, acetal, ether, hydroxyl or carboxy group.

15. A method for processing a photoresist composition, comprising: (a) applying on a substrate a photoresist composition; (b) applying above the photoresist composition an overcoating composition comprising a first resin, a second resin that is distinct from the first resin and a solvent comprising di(propylene glycol) mono methyl ether;
    (c) exposing the photoresist layer to radiation activating for the photoresist composition.

16. The method of claim 15, wherein the photoresist is immersion exposed and the substrate is a microelectronic wafer substrate.

17. The method of claim 15, wherein the photoresist is exposed to radiation having a wavelength of 193 nm.

18. The method of claim 15, wherein the solvent further comprises an alkane and/or a cycloalkane.

* * * * *